(12) United States Patent
Zhou

(10) Patent No.: US 11,145,756 B2
(45) Date of Patent: Oct. 12, 2021

(54) SEMICONDUCTOR STRUCTURE AND METHOD OF FORMING A SEMICONDUCTOR STRUCTURE

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shanghai (CN)

(73) Assignees: Semiconductor Manufacturing (Beijing) International Corporation, Beijing (CN); Semiconductor Manufacturing (Shanghai) International Corporation, Shanghai (CN)

(*) Notice: Subject to any disclaimer, the term of this patent is extended or adjusted under 35 U.S.C. 154(b) by 0 days.

(21) Appl. No.: 16/601,912

(22) Filed: Oct. 15, 2019

(65) Prior Publication Data

US 2020/0161470 A1    May 21, 2020

(30) Foreign Application Priority Data

Nov. 16, 2018    (CN) .......................... 201811368055.2

(51) Int. Cl.
*H01L 21/8234* (2006.01)
*H01L 29/78* (2006.01)
(Continued)

(52) U.S. Cl.
CPC ...... *H01L 29/7816* (2013.01); *H01L 21/3086* (2013.01); *H01L 21/823431* (2013.01); *H01L 29/66681* (2013.01); *H01L 29/7851* (2013.01)

(58) Field of Classification Search
CPC ............. H01L 29/66795; H01L 29/785; H01L 21/823431; H01L 21/823481;
(Continued)

(56) References Cited

U.S. PATENT DOCUMENTS

2016/0181358 A1*   6/2016   Zhang ................. H01L 29/6681
                                                           257/339
2017/0194487 A1*   7/2017   Chen .................... H01L 29/0869
(Continued)

*Primary Examiner* — Thanh Y. Tran

(57) ABSTRACT

A semiconductor structure and a method for forming a semiconductor structure are disclosed. A forming method may include: providing a base, including a first region used to form a well region and a second region used to form a drift region, where the first region is adjacent to the second region; and patterning the base, to form a substrate and fins protruding out of the substrate, where the fins include first fins located at a junction of the first region and the second region and second fins located on the second region, where the quantity of the second fins is greater than the quantity of the first fins. In some implementations of the present disclosure, the quantity of the second fins is increased to correspondingly increase the length of a flow path in which a current flows from a drain region to a source region, thereby reducing a voltage drop in the current flow path, and further improving a breakdown voltage of an LDMOS, to improve the device performance of the LDMOS.

16 Claims, 9 Drawing Sheets

(51) Int. Cl.
*H01L 21/308* (2006.01)
*H01L 29/66* (2006.01)

(58) Field of Classification Search
CPC .............. H01L 27/0886; H01L 29/7816; H01L 29/7851; H01L 21/3086; H01L 29/66681; H01L 29/0611
See application file for complete search history.

(56) References Cited

U.S. PATENT DOCUMENTS

2017/0345660 A1* 11/2017 Li ..................... H01L 29/66545
2018/0061981 A1*  3/2018 Zhou ................. H01L 29/66795
2019/0333768 A1* 10/2019 Li ..................... H01L 29/66659

\* cited by examiner

SEMICONDUCTOR STRUCTURE AND METHOD OF FORMING A SEMICONDUCTOR STRUCTURE

RELATED APPLICATIONS

The present application claims priority to Chinese Patent Appln. No. 201811368055.2, filed Nov. 16, 2018, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

As the use of semiconductor chips increases, factors that cause electrostatic damage to the semiconductor chips are also increasingly growing. In an existing chip design, an electrostatic discharge (ESD) protection circuit is generally used to reduce the chip damage. The design and application of the existing ESD protection circuit includes: a gate grounded N-type field effect transistor (Gate Grounded NMOS, GGNMOS for short) protection circuit, a silicon-controlled rectifier (SCR) protection circuit, a lateral double diffused field effect transistor (Lateral Double Diffused MOSFET, LDMOS for short) protection circuit, a bipolar junction transistor (BJT) protection circuit, and the like. The LDMOS is widely applied to ESD protection because it can bear a higher breakdown voltage.

With the development tendency of ultra-large-scale integrated circuits, a critical dimension (CD) of an integrated circuit is continuously reduced. A planar LDMOS cannot meet technical requirements, and gradually begins the transition to a three-dimensional transistor with higher efficacy. For example, a fin field effect transistor (FinFET) is introduced.

SUMMARY

A problem to be addressed in embodiments and implementations of the present disclosure is to provide a semiconductor structure and a forming method thereof, to improve the device performance of an LDMOS.

To address the foregoing problem, some implementations of the present disclosure provides a forming method of a semiconductor structure, including: providing a base, including a first region used to form a well region and a second region used to form a drift region, where the first region is adjacent to the second region; and patterning the base, to form a substrate and fins protruding out of the substrate, where the fins include first fins located at a junction of the first region and the second region and second fins located on the second region, and the quantity of the second fins is greater than the quantity of the first fins.

Some implementations of the present disclosure further provide a semiconductor structure, including: a substrate, including a first region used to form a well region and a second region used to form a drift region, where the first region is adjacent to the second region; and a fin, protruding out of the substrate, where the fins include first fins located at a junction of the first region and the second region and second fins located on the second region, and the quantity of the second fins is greater than the quantity of the first fins.

Compared with the prior art, the technical solutions of some implementations of the present disclosure have the following advantages:

In some implementations of the present disclosure, after a base is patterned to form a substrate and fins protruding out of the substrate, the quantity of second fins formed at a junction of a first region and a second region is greater than the quantity of first fins formed on the second region. In an LDMOS, a gate structure is generally formed at the junction of the first region and the second region, and covers a partial top of the first fin and a partial sidewall of the first fin located on one side of the second region. A source region of a device is generally formed in a first fin on one side of the gate structure, and a drain region is generally formed in a second fin on the other side of the gate structure. When the device is conducted, a current flows from the drain region to the source region, and the plurality of second fins has a shunting effect. A position closer to a border of the second region indicates a larger distance between a second fin at the position and a first fin and correspondingly a longer current flow path. Therefore, compared with a solution in which the first fins and the second fins are in a one-to-one correspondence, in some implementations of the present disclosure, the quantity of the second fins is increased to increase the length of a flow path in which a current of a partial region flows from a drain region to a source region, thereby reducing a voltage drop in the current flow path, and further improving a breakdown voltage (BVDS) of the LDMOS, to improve device performance of the LDMOS.

In some implementations, in a direction perpendicular to an extension direction of the fin, the second region includes a central region and an edge region located on two sides of the central region, and a step of forming the second fin includes: patterning a base of the second region, to form a first substrate located on the central region and a plurality of central fins protruding out of the first substrate, and a second substrate located on the edge region and at least one edge fin protruding out of the second substrate, where a region between neighboring central fins is a first groove, a region of two sides of the edge fin is a second groove, and the depth of the first groove is less than the depth of the second groove. Compared with the second substrate of the edge region, a volume proportion of the first substrate in the central region is higher. Therefore, a device formed in the central region has better heat dissipation performance, to correspondingly enhance a dissipation effect of heat generated by the drain region, thereby improving a self-heating effect of the device, so that the device performance of the LDMOS is further improved.

In some implementations, in a direction perpendicular to an extension direction of the fin, the width of the second fin is greater than the width of the first fin. The width of the second fin is increased to increase the area of a contact surface of the second fin and the substrate, and correspondingly enhance an effect of dissipating heat generated by the drain region to the substrate, and correspondingly improving the self-heating effect of the device, so that the device performance of the LDMOS is further improved.

DETAILED DESCRIPTION

At present, after a FinFET is introduced to an LDMOS, the device performance of the LDMOS remains relatively poor. The reasons for the device performance degradation is analyzed and discussed below with reference to a semiconductor structure.

Figure 1:
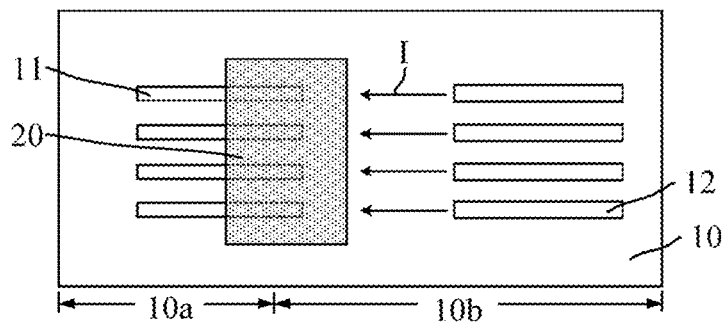
FIG. 1 is a schematic structural diagram of a semiconductor structure.

Referring to FIG. 1, FIG. 1 is a schematic structural diagram of a semiconductor structure.

The semiconductor structure includes: a substrate, including a first region 10a used to form a well region and a second region 10b used to form a drift region, where the first region 10a is adjacent to the second region 10b; fins (not marked), protruding out of the substrate 10, the fins include first fins 11 located at a junction of the first region 10a and the second region 10b, and second fins 12 located on the second region 10b; and a gate structure 20, located at the junction of the first region 10a and the second region 10b, where the gate structure 20 covers a partial top of the first fin 11, and a partial sidewall of the first fin 11 located on one side of the second region 10b.

In an LDMOS, a source region is generally located in a first fin 11 on one side of the gate structure 20, and a drain region is generally located in a second fin 12 on the other side of the gate structure 20. When the device is conducted, a current I flows from the drain region to the source region. With the continuous reduction of a graphic CD, a distance between the first fin 11 and the second fin 12 is continuously reduced. As a result, a flow path of the current I is shortened, a voltage drop on the path is correspondingly increased, and further a breakdown voltage of the LDMOS is reduced.

To address the technical problem, in embodiments and implementations of the present disclosure, a quantity of the second fins is made to be greater than a quantity of the first fins. A position closer to a border of the second region indicates a larger distance between a second fin at the position and a first fin and correspondingly a longer current flow path. Therefore, compared with a solution in which the first fins and the second fins are in a one-to-one correspondence, the length of a path in which a current flows from the drain region to the source region is increased, thereby reducing the voltage drop on the current flow path, and further improving the breakdown voltage of the LDMOS, to improve device performance of the LDMOS.

To make the foregoing objectives, features, and advantages of some implementations and implementations of the present disclosure clearer and more comprehensible, the following describes specific embodiments and implementations of the present disclosure in detail with reference to the accompanying drawings.

FIG. 2 to FIG. 14 are schematic structural diagrams corresponding to steps in one form of a method for forming a semiconductor structure according to the present disclosure.

Figure 2:
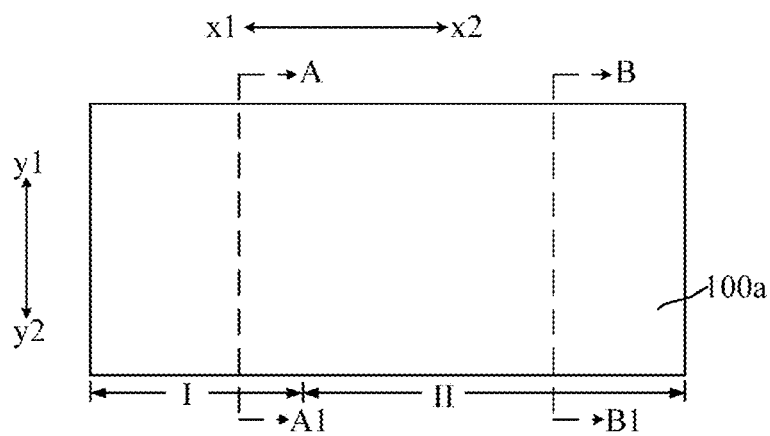
FIG. 2 to FIG. 14 are schematic structural diagrams corresponding to steps in one form of a method for forming a semiconductor structure.
Figure 3:
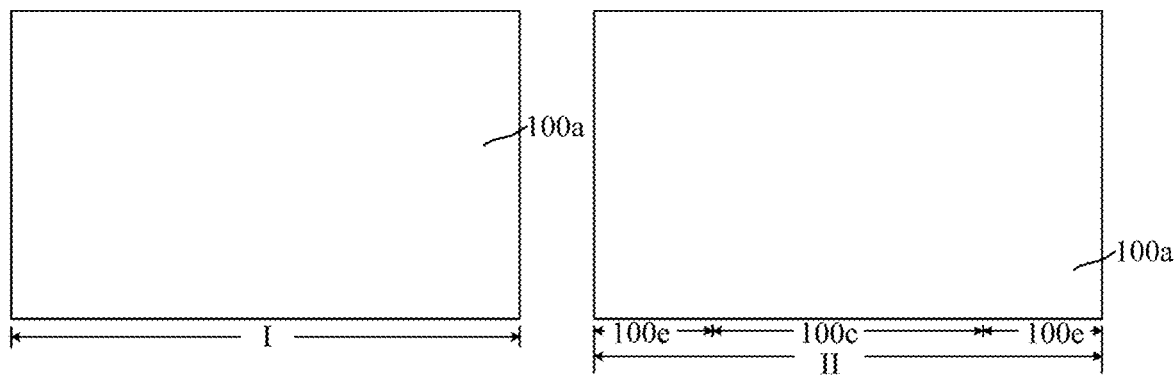

Referring to FIG. 2 and FIG. 3, FIG. 2 is a top view, and FIG. 3 is a sectional view along an AA1 secant line and a BB1 secant line in FIG. 2. A base 100a is provided, and includes a first region I used to form a well region and a second region II used to form a drift region, where the first region I is adjacent to the second region II.

The base 100a is used to provide a process foundation for subsequently forming a substrate and a fin.

In some implementations, the material of the base 100a is Si. In other implementations, the material of the base may be another material such as Ge, SiGe, SiC, GaAs, or InGa. The base may also be a base of another type, such as a Si base on an insulator or a Ge base on an insulator.

In some implementations, the base is used to form an LDMOS. Therefore, the forming method further includes: performing first doping processing, to form a well region (not shown in the figure) in the base 100a of the first region I, and performing second doping processing, to form a drift region (not shown in the figure) in the base 100a of the second region II, where types of doping ions are different in the second doping processing and the first doping processing.

It should be noted that, a direction in which the first region I points to the second region II is a first direction (as the x1x2 direction shown in FIG. 2), a direction perpendicular to the first direction is a second direction (as the y1y2 direction shown in FIG. 2), and the second region II along the second direction includes a central region 100c (as shown in FIG. 3) and an edge region 100e (as shown in FIG. 3) located on two sides of the central region 100c. The edge region 100e refers to a region that is in the second direction and close to a border of the second region II.

Figure 8:
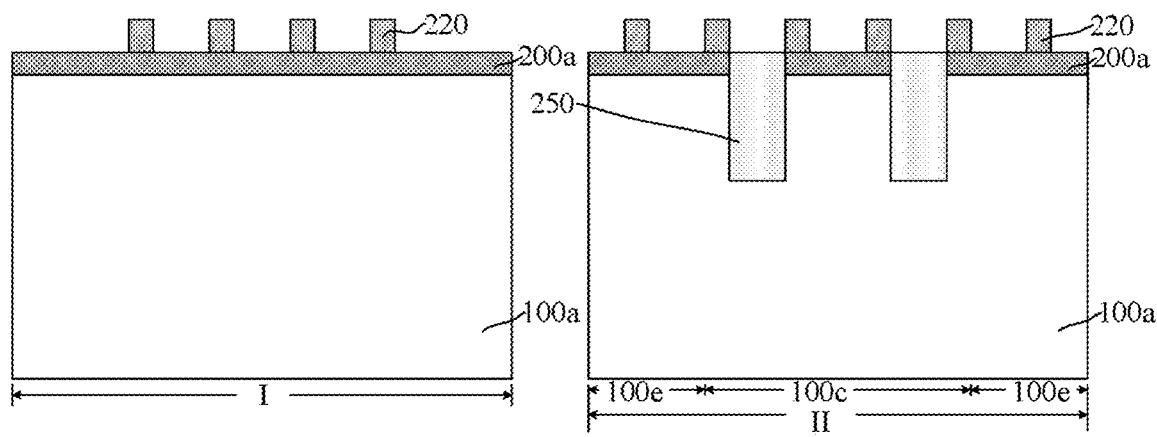
Figure 9:
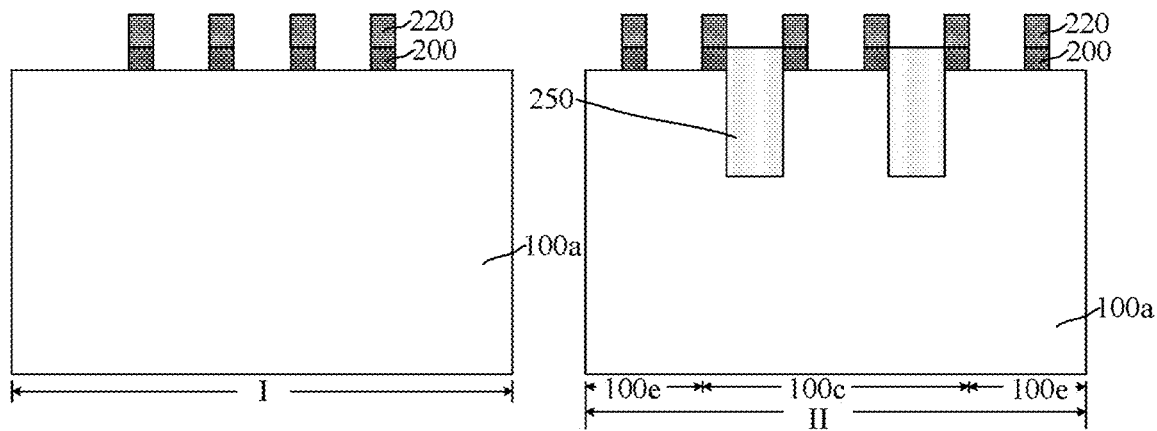
Figure 10:
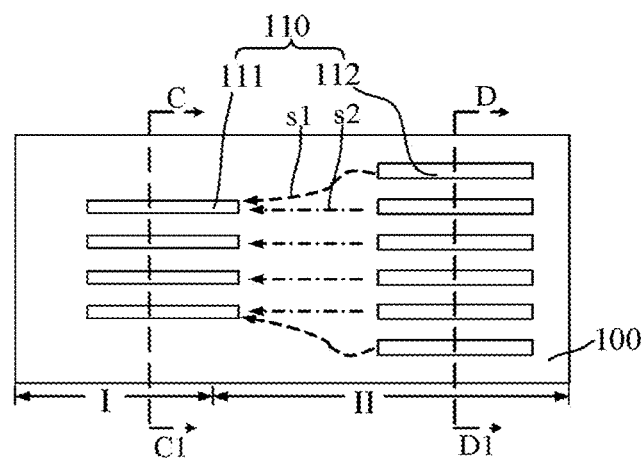

Referring to FIG. 4 to FIG. 12, the base 100a (as shown in FIG. 2) is patterned, to form a substrate 100 (as shown in FIG. 10) and fins 110 (as shown in FIG. 10) protruding out of the substrate 100, where the fins 110 include first fins 111 (as shown in FIG. 10) located at a junction of the first region I and the second region II, and second fins 112 (as shown in FIG. 10) located on the second region II, and the quantity of the second fins 112 is greater than the quantity of the first fins 111.

In some implementations, the fin 110 extends along the first direction (as the x1x2 direction shown in FIG. 2), the quantities of the first fins 111 and the second fins 112 are plural, the plurality of first fins 111 is arranged parallel along the second direction (as the y1y2 direction shown in FIG. 2), and the plurality of second fins 112 is arranged parallel along the second direction.

The quantity of the second fins 112 is greater than the quantity of the first fins 111. Compared with the second fin 112 located on the central region 100c (as shown in FIG. 3), the distance between the second fin 112 located on the edge region 100e and the first fin 111 is larger, and a position closer to a border of the second region II indicates a larger distance between the second fin 112 at the position and the first fin 111.

In the LDMOS, the gate structure is generally formed at the junction of the first region I and the second region II, and covers a partial top of the first fin 111 and a partial sidewall of the first fin 111 located on one side of the second region II, a source region is formed in the first fin 111 on one side of the gate structure, and a drain region is formed in the second fin 112 on the other side of the gate structure. When the device conducts, a current flows from the drain region to the source region, and the plurality of second fins 112 has a shunting effect. A position closer to a border of the second region II indicates a larger distance between the second fin 112 at the position and the first fin 111, and a longer current flow path. For example, the length of the current flow path (as the dotted arrow s1 shown in FIG. 10) when a device in the edge region 100e is conducted is greater than the length of the current flow path (as the crossed arrow s2 shown in FIG. 10) when a device in the central region 100c is conducted.

Therefore, compared with the solution in which the first fins and the second fins are in a one-to-one correspondence, in some implementations, the length of the flow path in which the current flows from the drain region to the source region is increased, thereby reducing the voltage drop on the current flow path, and further improving the breakdown voltage of the LDMOS, so that the device performance of the LDMOS is improved.

A ratio of the quantity of the second fins 112 to the quantity of the first fins 111 should not be excessively small or excessively large. If the ratio is excessively small, an effect of improving the breakdown voltage of the LDMOS is correspondingly worse. If the ratio is excessively large, the resistance of the second fin 112 is correspondingly larger, easily making a startup current (Ion) smaller, thereby affecting the normal performance of the device. Therefore, in some implementations, the quantity of the second fins 112 is 1.25 to 3 times, for example, 1.5 times, the quantity of the first fins 111.

In some specific implementations, for example, the quantity of the second fins 112 is 6, and the quantity of the first fins 111 is 4.

As shown in FIG. 9, in some implementations, a separated fin mask layer 200 is formed on the base 100a, and the fin mask layer 200 is used to define the position, the quantity, the shape, and the dimension of the fin 110. Therefore, different quantities of fin mask layers 200 are formed in the first region I and the second region II, so that the quantity of the second fins 112 is greater than the quantity of the first fins 111, the process is simple, and the process compatibility is relatively high.

A material of the fin mask layer 200 is a hard mask material. The material of the fin mask layer 200 may be SiN, SiO, SiON, SiOC, a-C, SiOCN, or a lamination of them. In some implementations, the material of the fin mask layer 200 is SiN.

In some implementations, to adapt to the continuous reduction of the graphic CD, the fin mask layer 200 is formed by using a self-aligned double patterning (SADP) process.

Figure 6:
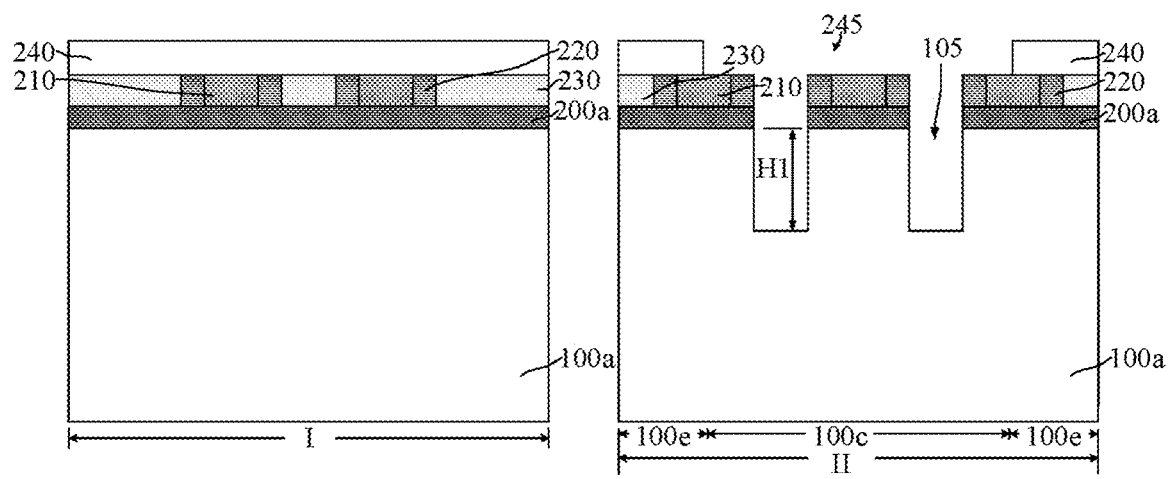
Figure 11:
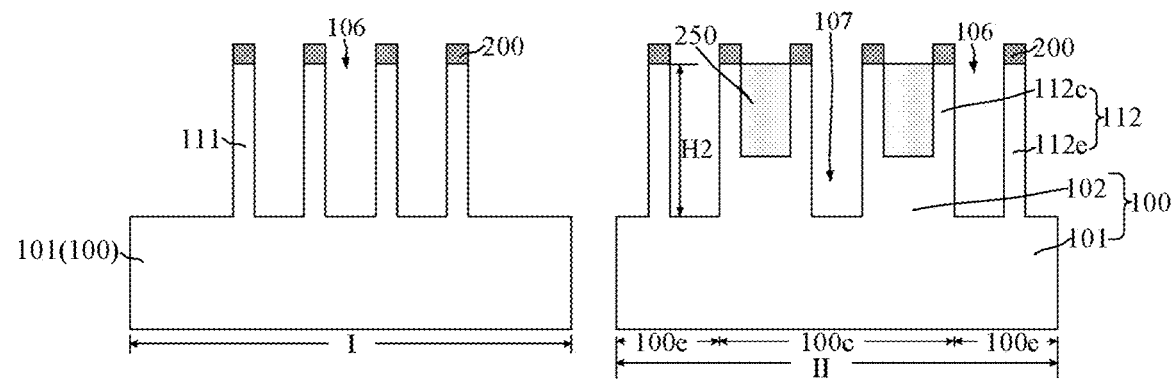
Figure 12:
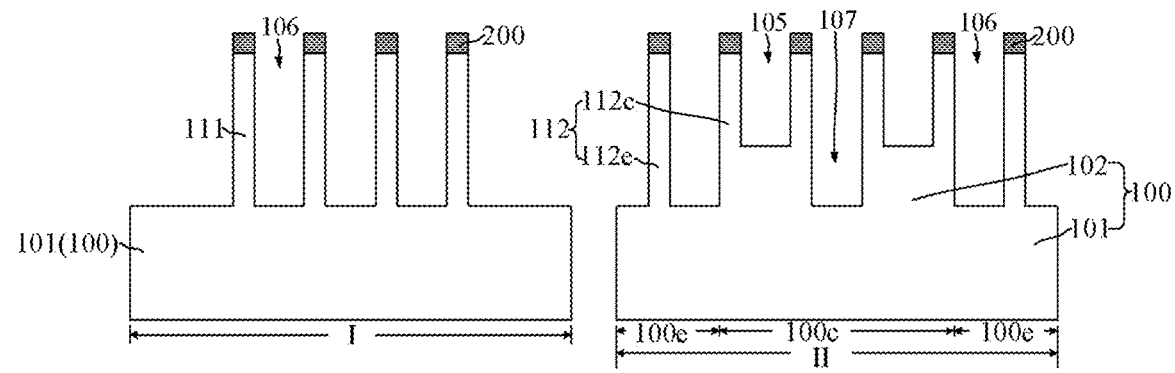

As shown in FIG. 12, in some implementations, a step of forming the second fin 112 includes: patterning the base 100a (as shown in FIG. 9) of the second region II, to form a first substrate 102 located on the central region 100c and a plurality of central fins 112c protruding out of the first substrate 102, and a second substrate 101 located on the edge region 100e and at least one edge fin 112e protruding out of the second substrate 101. A region between neighboring central fins 112c is a first groove 105, a region of two sides of the edge fin 112e is a second groove 106, and the depth H1 (as shown in FIG. 6) of the first groove 105 is less than the depth H2 (as shown in FIG. 11) of the second groove 106.

Compared with a device in the edge region 100e, a device in the central region 100c is more difficult in heat dissipation, and after the quantity of the second fins 112 is increased, heat generated by the drain region is correspondingly increased. Therefore, the depth H1 of the first groove 105 is made to be less than the depth H2 of the second groove 106, to increase a volume proportion of the first substrate 102 in the central region 100c, thereby improving the heat dissipation performance of the device in the central region 100c, and correspondingly enhancing the dissipation effect of the heat generated by the drain region, thereby further improving a self-heating effect of the device, so that the device performance of the LDMOS is further improved.

The depth H2 of the second groove 106 is relatively large, and after an isolation structure is subsequently formed on the substrate 100 exposed by the fin 110, the thickness of the isolation structure of the edge region 100e is relatively large, so that the isolation structure still has a better isolation effect, to help reduce the probability of increasing a leakage current of the device.

The following describes steps of forming the substrate 100 and the fin 110 in detail with reference to the accompanying drawings.

Figure 4:
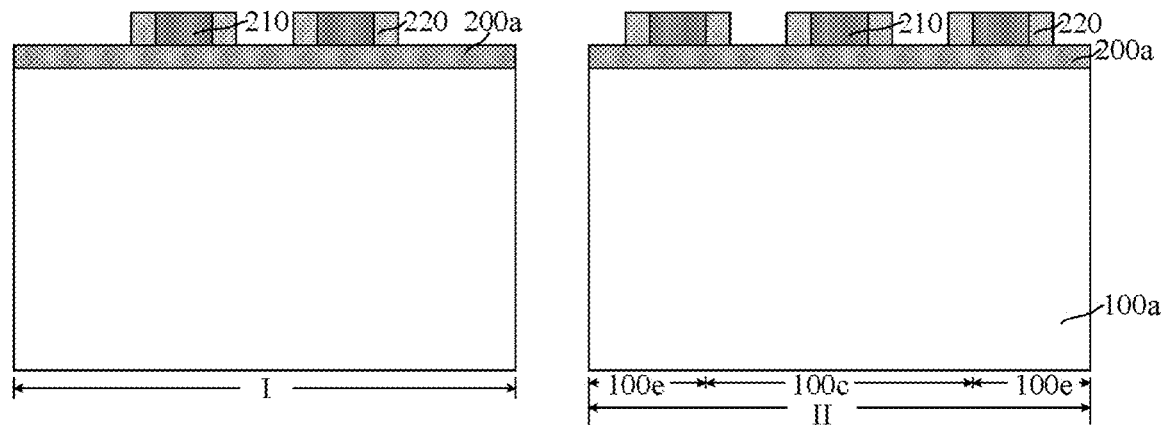

Referring to FIG. 4, a mask material layer 200a is formed on the base 100a; a core layer 210 is formed on the mask material layer 200a; and a mask sidewall 220 is formed on a sidewall of the core layer 210.

The mask material layer 200a is used to provide a process foundation for subsequently forming a fin mask layer. Therefore, in some implementations, the material of the mask material layer 200a is SiN.

The core layer 210 is used to define a spacing between neighboring subsequent fins, and is used to provide a process foundation for forming the mask sidewall 220.

The core layer 210 is a material easily removed, and a process of subsequently removing the core layer 210 has less losses to the mask material layer 200a and the mask sidewall 220. Therefore, the material of the core layer 210 may be a-Si, a-C, a-Ge, Poly-Si, an organic dielectric layer (ODL) material, a dielectric anti-reflective coating (DARC) material, or a bottom anti-reflective coating (BARC) material. In some implementations, based on actual situations, the material of the core layer 210 is a-C.

The mask sidewall 220 is used as a mask for patterning the mask material layer 200a subsequently, and may also be used as a mask for patterning the base 100a subsequently. Therefore, in some implementations, the material of the mask sidewall 220 is SiN. In other implementations, based on the material of the core layer, the material of the mask sidewall may also be SiO, SiON, CN, SiC, SiOC, SiCN, SiOCN, or BN.

Figure 5:
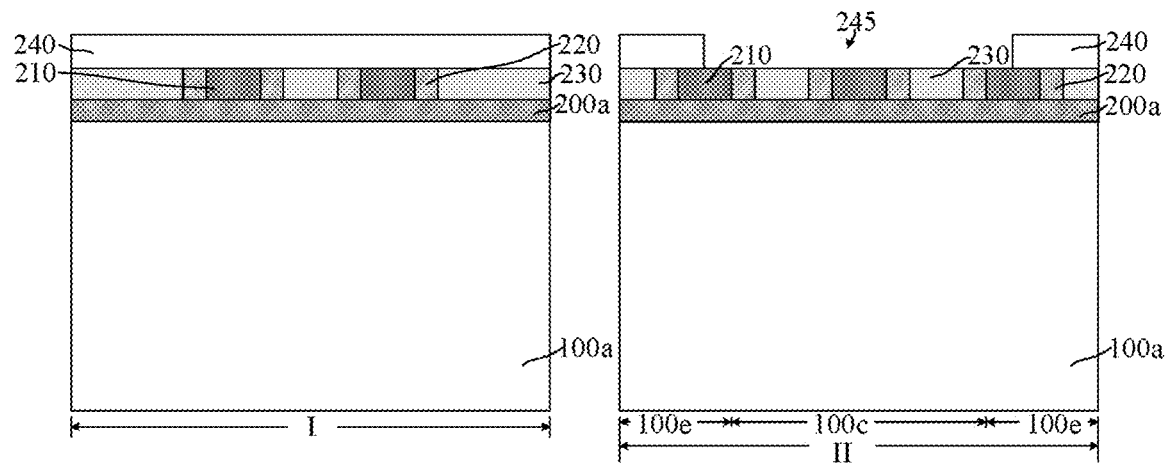

Referring to FIG. 5, a sacrificial layer 230 is formed on the core layer 210 and the mask material layer 200a exposed by the mask sidewall 220. A graphic layer 240 covering at least a sacrificial layer 230 of the edge region 100e is formed, and a graphic opening 245 exposing a sacrificial layer 230 of the central region 100c is formed in the graphic layer 240.

The sacrificial layer 230 is used to provide a process platform for forming the graphic layer 240.

The sacrificial layer 230 is a material easily removed, and a process for subsequently removing the sacrificial layer 230 has less losses to the core layer 210, the mask material layer 200a, and the mask sidewall 220, that is, etching selection ratios of the sacrificial layer 230 to the core layer 210, the mask material layer 200a, and the mask sidewall 220 are relatively high.

In some implementations, the material of the sacrificial layer 230 is a BARC material. The sacrificial layer 230 is used to provide a flat surface for forming the graphic layer 240, thereby improving the shape quality, the position precision, and the dimension precision of the graphic layer 240; and a process of removing the BARC material is relatively simple, and the process risk is relatively low. In other embodiments, based on actual situations, the material of the sacrificial layer may also be SiO, SiN, or SiON.

In some implementations, the material of the graphic layer 240 is photoresist, thereby simplifying the process difficulty in forming the graphic layer 240. The sacrificial layer 230 can reduce a reflection effect during exposure, to help improve the exposure uniformity. Therefore, the shape quality of the graphic layer 240 is relatively good, and the position accuracy and the dimension precision of the graphic opening 245 are relatively high.

It should be noted that, because the etching selection ratios of the sacrificial layer 230 to the core layer 210, and the mask sidewall 220 are relatively high, the graphic layer 240 only needs to cover the sacrificial layer 230 of the edge region 100e. Correspondingly, a process window for forming the graphic opening 245 is enlarged, and requirements for the dimension precision of the graphic opening 245 and the alignment precision of a photoresist process are reduced.

In some implementations, the graphic layer 240 further covers a part of the core layer 210 of the edge region 100e. In other implementations, the graphic layer may further cover the core layer and the mask sidewall of the central region, and only the sacrificial layer of the central region is exposed.

Further, it should be noted that, to avoid impact on the forming of the first fin in a subsequent procedure, the graphic layer further covers the first region I and the junction of the first region I and second region II.

Referring to FIG. 6, the sacrificial layer 230, the mask material layer 220a, and the base 100a of a partial thickness are etched sequentially using the graphic layer 240, the core layer 210, and the mask sidewall 220 as masks, and the first groove 105 is formed in the base 100a of the central region 100c.

The first groove 105 is used to provide a process foundation for subsequently forming the second fin. The depth H1 of the first groove 105 is used to define the height of the second fin subsequently, and the sidewall of the first groove 105 is a sidewall of two neighboring second fins subsequently.

It should be noted that, the depth H1 of the first groove 105 should not be excessively small or excessively large. If the depth H1 is excessively large, the effect for increasing the volume proportion of the first substrate in the central region 100c is relatively poor, thereby reducing the dissipation effect of heat generated by the drain region when the device works. This does not help improve the heat dissipation performance of the device in the central region 100c. If the depth H1 is excessively small, the thickness of the isolation structure formed subsequently is easily excessively small, and a problem of increasing a leakage current of the device is easily caused. Therefore, in some implementations, the depth H1 of the first groove 105 is 350 Å to 800 Å.

Figure 7:
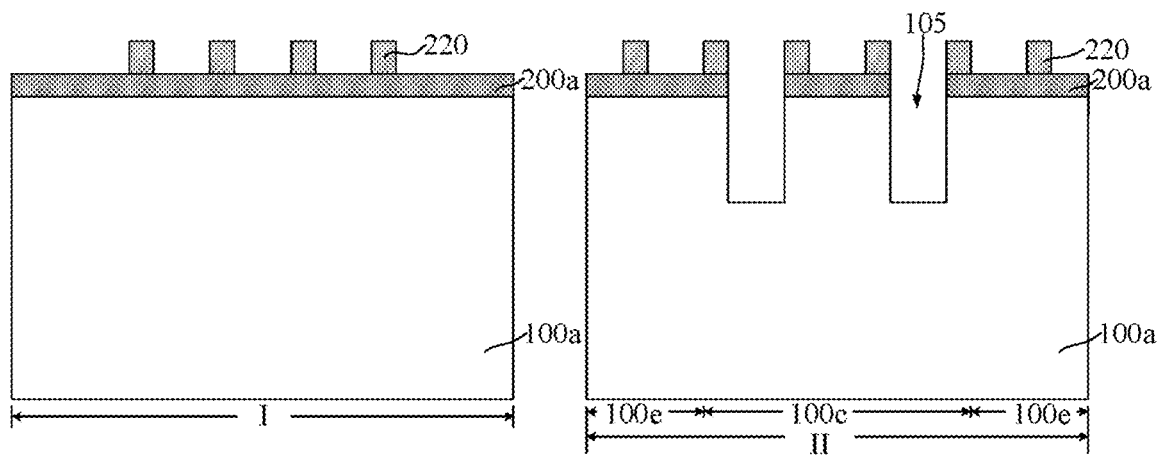

Referring to FIG. 7, after the first groove 105 is formed, the graphic layer 240 (as shown in FIG. 6), the core layer 210 (as shown in FIG. 6), and the sacrificial layer 230 (as shown in FIG. 6) are removed.

The graphic layer 240, the core layer 210, and the sacrificial layer 230 are removed to provide a process foundation for the step of subsequently patterning the mask material layer 200a.

Referring to FIG. 8, after the graphic layer 240 (as shown in FIG. 6), the core layer 210 (as shown in FIG. 6), and the sacrificial layer 230 (as shown in FIG. 6) are removed, a filling layer 250 is formed in the first groove 105 (as shown in FIG. 7).

The filling layer 250 has a protection effect on a base 100a at the bottom of the first groove 105 in the process of subsequently patterning the base 100a, thereby avoiding the impact caused by the subsequent process for the depth H1 (as shown in FIG. 6) of the first groove 105.

In some implementations, a material of the filling layer 250 is a BARC material. The BARC material is used to help improve a filling effect of the filling layer 250 in the first groove 105 and help reduce the process difficulty in forming the filling layer 250, and the process difficulty in removing the filling layer 250 subsequently. In other implementations, based on actual situations, the material of the filling layer may also be SiO, SiN, or SiON.

Specifically, a coating process and an etching back process are combined to make the filling layer 250 expose the mask material layer 220a, thereby providing a process foundation for subsequently patterning the mask material layer 220a.

In some implementations, a top of the filling layer 250 is aligned with a top of the mask material layer 220a. In other implementations, the top of the filling layer may also be lower than the top of the mask material layer, and the thickness of the filling layer only needs to have a protection effect on the base at the bottom of the first groove.

Referring to FIG. 9, after the filling layer 250 is formed, the mask material layer 200a (as shown in FIG. 8) is etched using the mask sidewall 220 as a mask, and a residual mask material layer 200a obtained after the etching is used as a fin mask layer 200.

As can be known from the foregoing description, the position of the first groove 105 (as shown in FIG. 7) corresponds to the sacrificial layer 230 (as shown in FIG. 5) of the central region 100c. Therefore, after the fin mask layer 200 is formed, a sidewall of the first groove 105 is aligned with a sidewall of two neighboring fin mask layers 200.

It should be noted that, a filling layer 250 is formed in the first groove 105. Therefore, the probability that the process of etching the mask material layer 200a causes losses to the base 100a at the bottom of the first groove 105 is relatively low.

Referring to FIG. 10 and FIG. 11, FIG. 10 is a top view (only a substrate and fins are shown), and FIG. 11 is a sectional view along a CC1 secant line and a DD1 secant line in FIG. 10. The base 100a (as shown in FIG. 9) is etched by using the fin mask layer 200 and the filling layer 150 as masks, and the second groove 106 is formed in the base 100a of the edge region 100e.

In some implementations, after the second groove 106 is formed, the residual base 100a is used as the substrate 100, and protrusions located on the substrate 100 is used to as fins 110.

Specifically, in the second region II, a substrate 100 located on the central region 100c is a first substrate 102, a substrate located on the edge region 100e is a second substrate 101, and a sidewall of the second groove 106 close to one side of the central region 100c is a junction of the central region 100c and the edge region 100e. A bottom surface of the first groove 105 (as shown in FIG. 7) is a top surface of the first substrate 102, and a bottom surface of the second groove 106 is a top surface of the second substrate 101.

It should be noted that, in a process of forming the second groove 106, both the base 100a of the second region II and the base 100a of the first region I are etched. Therefore, the second groove 106 is further formed in the base 100a of the first region I, the fin 100 is correspondingly further formed on the substrate 100 of the first region I, and the substrate 100 of the first region I is the second substrate 101.

In some implementations, the fins 110 include first fins 111 located at the junction of the first region I and the second region II, and second fins 112 located on the second region II. Correspondingly, a region between neighboring first fins 111 is also the second groove 106.

In some implementations, because the quantity of fin mask layers 200 of the second region II is greater than the quantity of fin mask layers 200 at the junction of the first region I and the second region II, the quantity of the second fins 112 is greater than the quantity of the first fins 111.

In some implementations, the second fin 112 includes a plurality of central fins 112c located on the first substrate 102, and at least one edge fin 112e located on the second substrate 101. The depth H2 of the second groove 106 is used to define the heights of the edge fin 112e and the first fin 111.

Therefore, the depth H2 of the second groove 106 should not be excessively small or excessively large. If the depth H2 is excessively small, the thickness of an isolation structure subsequently is easily excessively small, and a problem of increasing a leakage current is easily caused. If the depth H2 is excessively large, the thickness of the second substrate 101 is excessively small, the thickness of the isolation structure subsequently is correspondingly excessively large. The material of the isolation structure is generally SiO, and a heat conductivity coefficient of SiO is less than a heat conductivity coefficient of Si. Therefore, the heat dissipation performance of the device in the edge region 100e is easily reduced. Therefore, in this embodiment, the depth H2 of the second groove 106 is 1000 Å to 2000 Å.

In some implementations, only one edge fin 112e is formed on the second substrate 101 on one side of the first substrate 102. Therefore, a region of two sides of the edge fin 112e is the second groove 106. In other implementations, when a plurality of edge fins is formed on the second substrate on one side of the first substrate, the second groove may also be a region between neighboring edge fins.

It should be noted that, as shown in FIG. 6, the mask sidewall 220 is formed on the sidewall of the core layer 210, and a core layer 210 between neighboring first grooves 105 is removed before the second groove 106 is formed. Therefore, as shown in FIG. 11, in the step of etching the base 100a by using the fin mask layer 200 and the filling layer 250 as masks, a base 100a between neighboring filling layers 250 is further etched.

Correspondingly, after the second groove 106 is formed, a third groove 107 is formed in a first substrate 102 between the neighboring first grooves 105, a sidewall of the third groove 107 is aligned with a sidewall of two neighboring central fins 112c, and a bottom of the third groove 107 is aligned with a bottom of the second groove 106.

Therefore, in some implementations, the depth of the third groove 107 is a difference between the depth H2 of the second groove 106 and the depth H1 (as shown in FIG. 6) of the first groove 105.

The forming of the third groove 107 increases the thickness of the isolation structure in a partial region of the central region 100e, to help further reduce the probability of increasing the leakage current of the device.

Referring to FIG. 12, FIG. 12 is a sectional view based on FIG. 11. After the substrate 100 and the fins 110 are formed, the filling layer 250 (as shown in FIG. 11) is removed.

The filling layer 250 is removed to provide a process foundation for a subsequent process.

Figure 13:
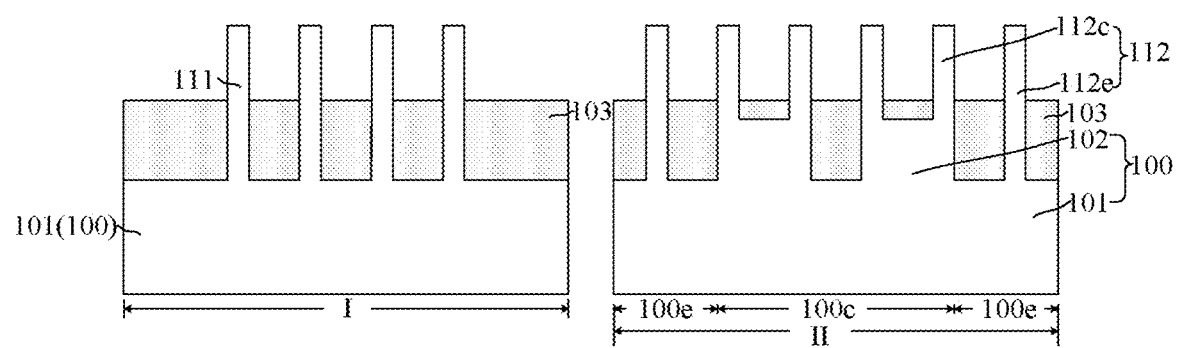

Referring to FIG. 13, after removing the filling layer 250, the method further includes: forming an isolation structure 103 on the substrate 100 exposed by the fin 110 (as shown in FIG. 10), where a top of the isolation structure 103 is lower than a top of the fin 110, and the isolation structure 103 covers a partial sidewall of the fin 110.

The isolation structure 103 is used to having an isolation effect on neighboring devices. In some implementations, the material of the isolation structure 103 is SiO. In other implementations, the material of the isolation structure may also be SiN or SiON.

After forming the isolation structure 103, the method further includes removing the fin mask layer 200 (as shown in FIG. 12), thereby providing a process foundation for subsequently forming a gate structure.

It should be noted that, in some implementations, a third groove 107 (as shown in FIG. 12) is further formed in the first substrate 102. Therefore, the isolation structure 103 is further formed in the third groove 107.

Figure 14:
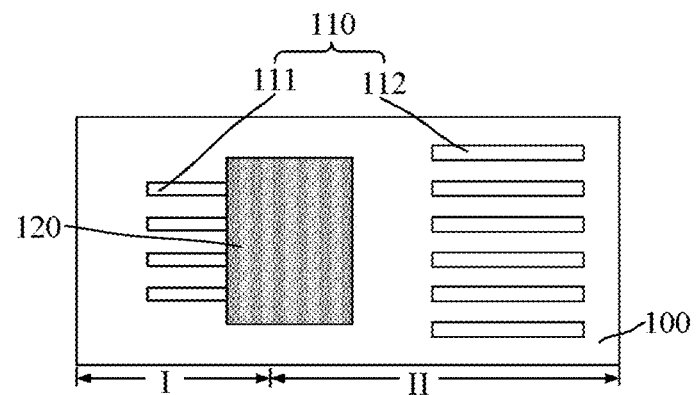

Referring to FIG. 14, FIG. 14 is a top view based on FIG. 13 (the isolation structure is not shown). A gate structure 120 located at the junction of the first region I and the second region II is formed, and the gate structure 120 covers a partial top of the first fin 111, and a partial sidewall of the first fin 111 located on one side of the second region II.

In some implementations, based on process requirements, the gate structure 120 may be a polygate structure, or may be a metalgate structure.

It should be noted that, the subsequent procedure further includes: forming a source region in the first fin 111 on one side of the gate structure 120, and forming a drain region in the second fin 112 on the other side of the gate structure 120. Specific descriptions of the source region and the drain region are not described herein again in this implementation.

FIG. 15 to FIG. 18 are schematic structural diagrams corresponding to steps in another form of a method for forming a semiconductor structure.

The similarity of these implementations and the foregoing implementations is not described herein again. The difference of these implementations from the foregoing implementations is: After a second groove 1060 (as shown in FIG. 16) is formed, a first groove 1050 (as shown in FIG. 17) is formed.

Figure 15:
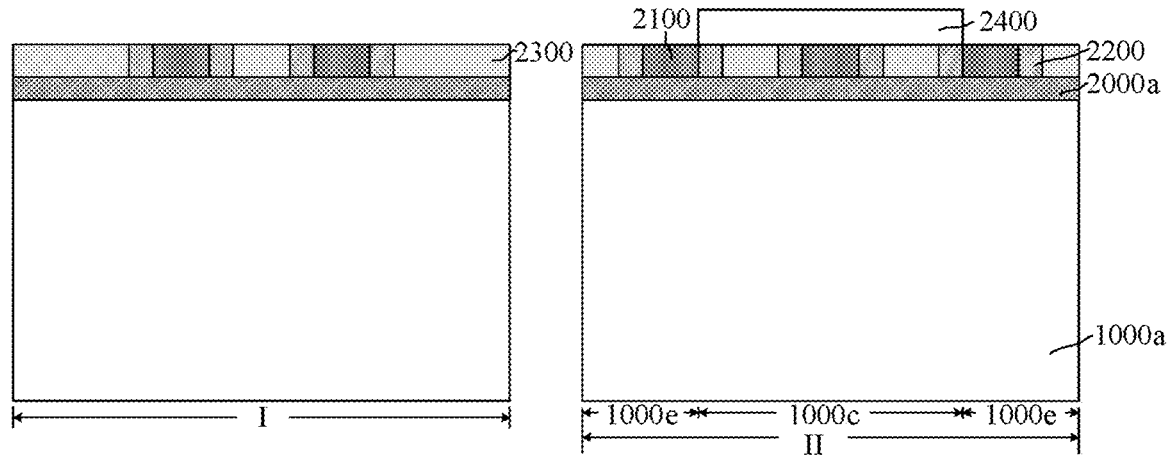
FIG. 15 to FIG. 18 are schematic structural diagrams corresponding to steps in another form of a method for forming a semiconductor structure.

Specifically, referring to FIG. 15, after a core layer 2100, a mask sidewall 2200, and a sacrificial layer 2300 are formed, a graphic layer 2400 covering the central region 100c is formed.

Figure 16:
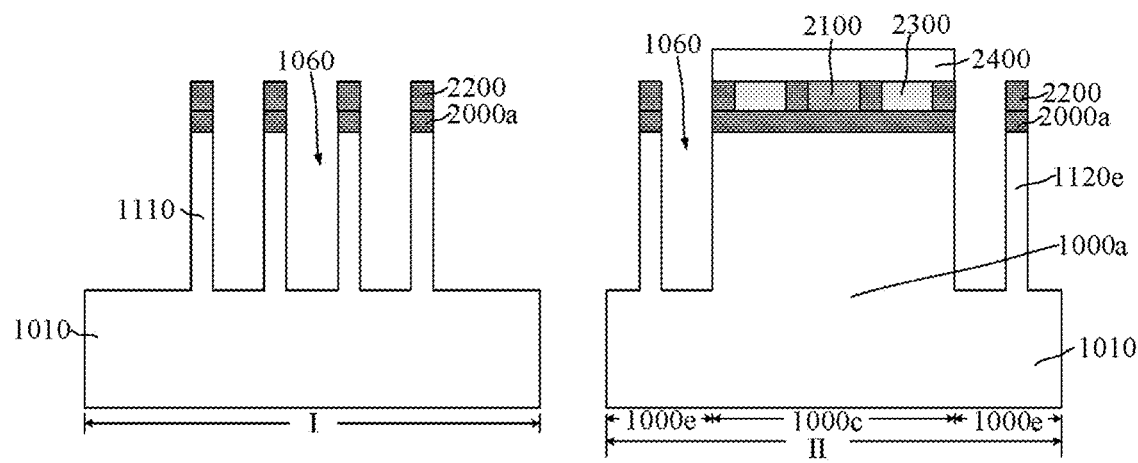
Figure 17:
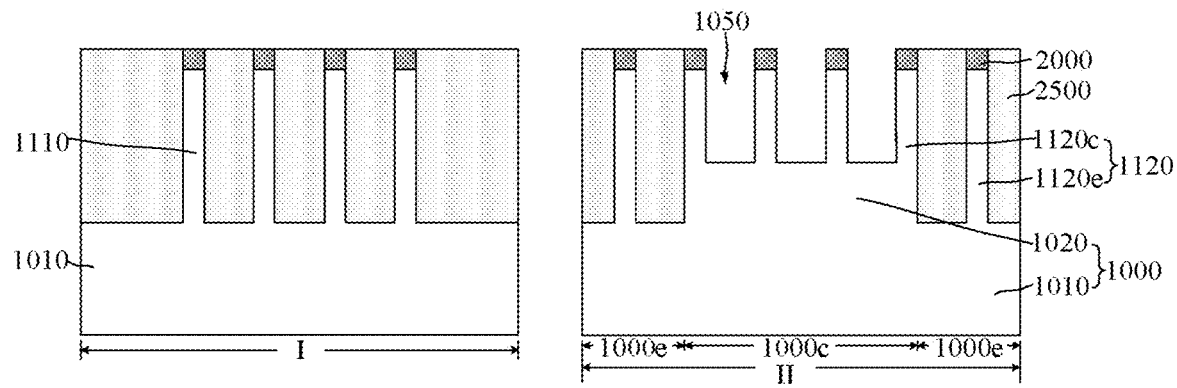

Referring to FIG. 16, the core layer 2100 and the sacrificial layer 2300 of the edge region 1000e are removed using the graphic layer 2400 as a mask. After the core layer 2100 and the sacrificial layer 2300 of the edge region 1000e are removed, a mask material layer 2000a and a base 1000a of a partial thickness are sequentially etched using the graphic layer 2400 and the mask sidewall 2200 as masks, and the second groove 1060 is formed in the base 1000a of the edge region 1000e.

In some implementations, after the second groove 1060 is formed, the residual base 1000a of the edge region 1000e is used to as a second substrate 1010, a protrusion located on the second substrate 1010 is used as an edge fin 1120e, and a region of two sides of the edge fin 1120e is the second groove 1060. A bottom surface of the second groove 1060 is a top surface of the second substrate 1010.

It should be noted that, in the etching step, not only the base 1000a of the edge region 1000e is etched, but also the base 1000a on the first region I and the base 1000a at the junction of the first region I and the second region II are etched. Therefore, the second groove 1060 is further formed in the base 1000a of the first region I, and in the base 1000a at the junction of the first region I and the second region II.

Correspondingly, after the second groove 1060 is formed, the residual base 1000a on the first region I and the residual base 1000a at the junction of the first region I and the second region II are the second substrate 1010, and a protrusion on the second substrate 1010 located at the junction of the first region I and the second region II are used as a first fin 1110. The second groove 1060 is correspondingly further a region between neighboring first fins 1110, and a region on two sides of the first fin 1110.

Figure 18:
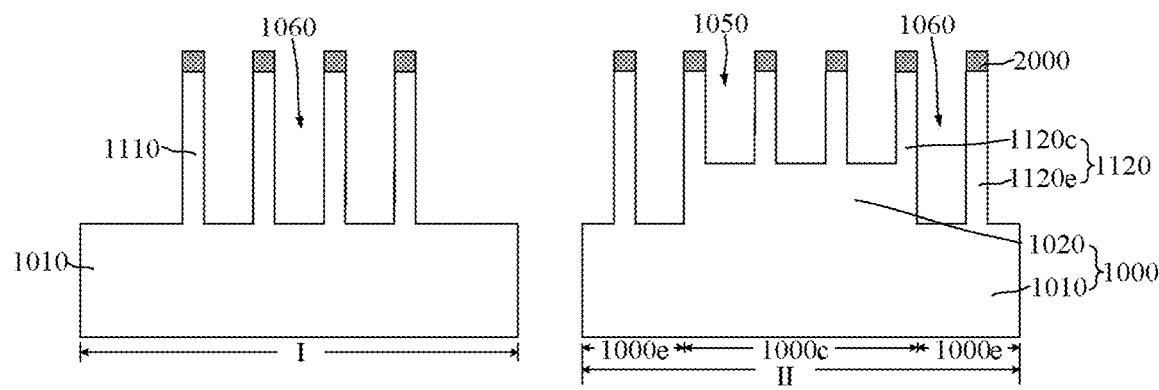

Referring to FIG. 17 and FIG. 18, after the second groove 1060 (as shown in FIG. 16) is formed, the graphic layer 2400 (as shown in FIG. 16), the core layer 2100 (as shown in FIG. 16), and the sacrificial layer 2300 (as shown in FIG. 16) are removed. After the graphic layer 2400, the core layer 2100, and the sacrificial layer 2300 are removed, a filling layer 2500 is formed in the second groove 1060. The mask material layer 2000a (as shown in FIG. 16) is etched by using the mask sidewall 2200 (as shown in FIG. 16) as a mask, and a residual mask material layer 2000a obtained after the etching is used as a fin mask layer 2000. The base 1000a is etched using the fin mask layer 2000 and the filling layer 2500 as masks, and the first groove 1050 is formed in the base 1000a of the central region 1000c. After the first groove 1050 is formed, the filling layer 2500 is removed.

In some implementations, after the first groove 1050 is formed, the residual base 1000a of the central region 1000c are used as a first substrate 1020, a protrusion located on the first substrate 1020 is used as a central fin 1120c, and a region between neighboring central fins 1120c is the first groove 1050. A bottom surface of the first groove 1050 is a top surface of the first substrate 1020.

In some implementations, the depth of the first groove 1050 is less than the depth of the second groove 1060.

In some implementations, the first substrate 1020 and the second substrate 1010 are used to form the substrate 1000, and the central fin 1120c and the edge fin 1120e are used to form the second fin 1120.

In describing illustrative implementations of a method for forming a semiconductor structure, reference may be made to corresponding descriptions in the foregoing implementations. Details are not described herein again in these implementations.

FIG. 19 to FIG. 25 are schematic structural diagrams corresponding to steps in still another form of a method of forming a semiconductor structure.

Figure 22:
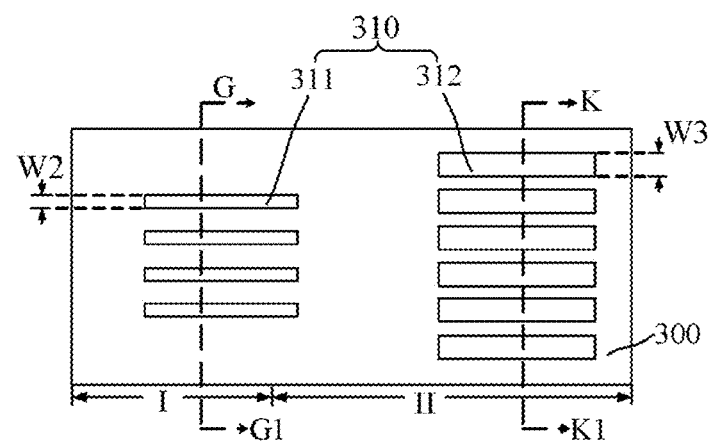

The similarity of these implementations and the foregoing implementations is not described herein again. The difference of these implementations from the foregoing implementations is: As shown in FIG. 22, in a direction perpendicular to an extension direction of the fin 310, the second fin 312 has a first width W3, the first fin 311 has a second width W2, and the first width W3 is greater than the second width W2.

In some implementations, the quantity of the second fins 312 is greater than the quantity of the first fins 311, thereby improving the breakdown voltage of the LDMOS.

Moreover, as can be known from the foregoing description, in the LDMOS, a gate structure is formed at a junction of a first region I and a second region II, and covers a partial top of the first fin 311 and a partial sidewall of the first fin 311 located on one side of the second region II. A source region is formed in the first fin 311 on one side of the gate structure, and a drain region is formed in the second fin 312 on the other side of the gate structure. In some implementations, the first width W3 of the second fin 312 is increased to increase the volume of the second fin 312, and the area of a contact surface of the second fin 312 and the substrate 300 (as shown in FIG. 22), to correspondingly enhance an effect of dissipating heat generated by the drain region to the substrate 300, thereby improving a self-heating effect of the device, so that the device performance of the LDMOS is further improved. The first width W3 of the second fin 312 may be increased to further accelerate the speed of the current flowing out of the drain region, and reduce the probability that electrostatic charges accumulated near the second fin 312, to help further improve the breakdown voltage of the LDMOS.

It should be noted that, a difference between the first width W3 and the second width W2 should not be excessively small or excessively large. If the difference is excessively small, the effect of improving the self-heating effect of the device is correspondingly worse. If the difference is excessively large, in a situation in which the first width W3 is fixed, the first width W3 is excessively large. This not only increases the process difficulty in forming the second fin 312, but also easily causes an excessively small spacing between neighboring second fins 312, thereby affecting the forming of the isolation structure subsequently. Therefore, in some implementations, a difference between the first width W3 and the second width W2 is 2 nm to 8 nm.

Figure 19:
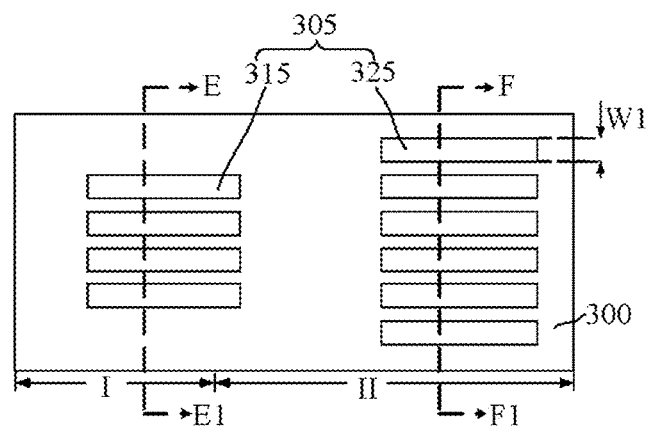
FIG. 19 to FIG. 25 are schematic structural diagrams corresponding to steps in still another form of a method for a forming a semiconductor structure.
Figure 20:
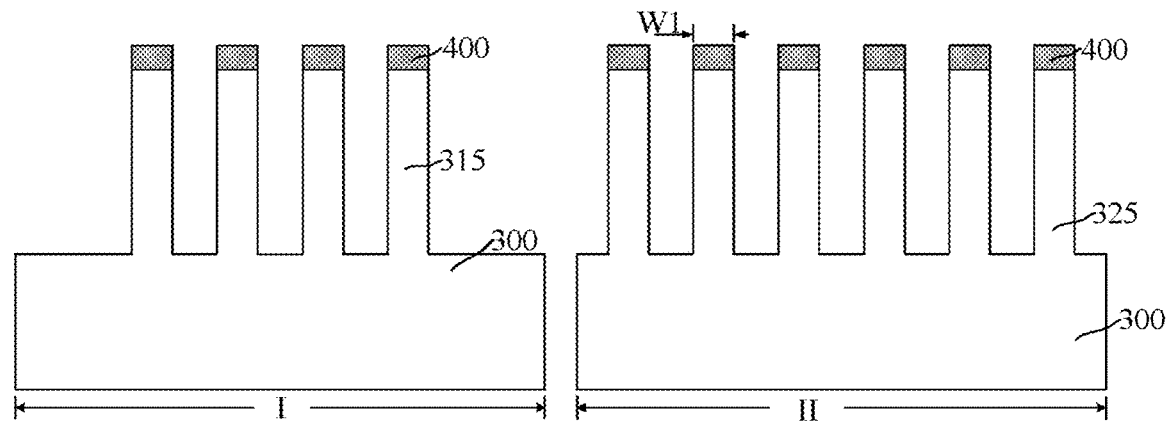

Specifically, referring to FIG. 19 and FIG. 20, FIG. 19 is a top view (only a substrate and an initial fin are shown), and FIG. 20 is a sectional view along an EE1 secant line and an FF1 secant line in FIG. 19. A base is patterned, to form a substrate 300 and initial fins 305 protruding out of the substrate 300. The initial fins 305 include a first initial fin 315 located at the junction of the first region I and the second region II, and a second initial fin 325 located on the second region II.

The first initial fin 315 is used to provide a process foundation for subsequently forming a first fin, and the second initial fin 325 is used to provide a process foundation for subsequently forming a second fin.

It should be noted that, a direction in which the first region I points to the second region II is a first direction (not marked), a direction perpendicular to the first direction is a second direction (not marked), the initial fin 305 extends along the first direction, the first initial fin 315 is arranged parallel along the second direction, and the second initial fin 325 is arranged parallel along the second direction.

In some implementations, after the initial fin 305 is formed, the widths of the first initial fin 315 and the second initial fin 325 are equal along the second direction, and the first initial fin 315 and the second initial fin 325 have an initial width W1.

In some implementations, to reduce the process complexity and provide the process feasibility, the initial width W1 is equal to the width of the second fin formed subsequently, so that a first fin with a smaller width can be formed by reducing the width of the first initial fin 315.

In some implementations, the initial width W1 should not be excessively small or excessively large. If the initial width W1 is excessively small, the width of the second fin subsequently is correspondingly excessively small, and the effect of improving the self-heating effect of the device is correspondingly worse. If the initial width W1 is excessively large, the width of the subsequent second fin is excessively large, the forming of the isolation structure subsequently is easily affected, and the process difficulty in reducing the width of the first initial fin 315 subsequently is further easily increased. Therefore, in this embodiment, the initial width W1 is 8 nm to 15 nm.

A fin mask layer 400 is formed on the top of the initial fin 305, and the fin mask layer 400 is used as an etching mask for forming the initial fin 305. In some implementations, the material of the fin mask layer 400 is SiN.

Figure 21:
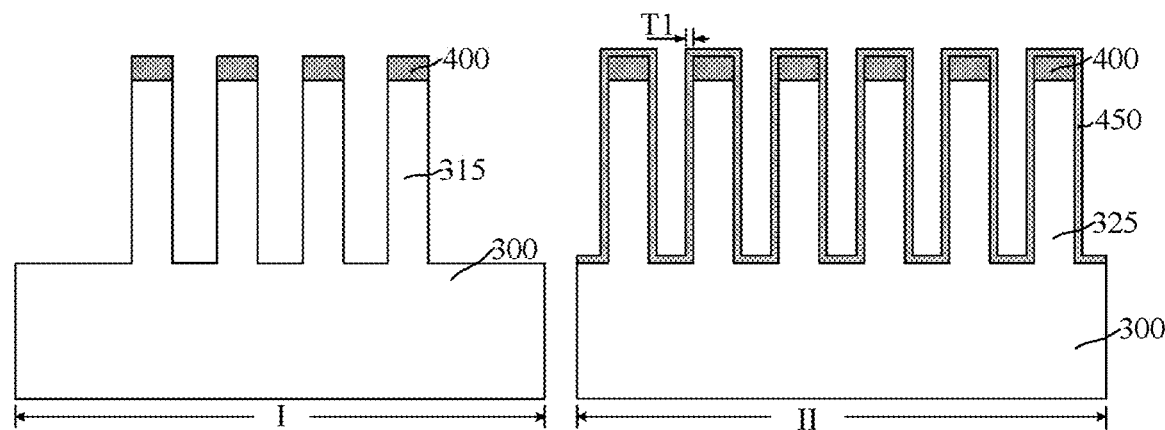

Referring to FIG. 21, a protection layer 450 is formed on a sidewall of the second initial fin 325.

The protection layer 450 is used to have a protective effect on the sidewall of the second initial fin 325, to reduce the probability that the initial width W1 of the second initial fin 325 changes in subsequent oxidization.

Therefore, a material of the protection layer 450 is selected as: In a subsequent oxidization process, the protection layer 252 is not easily oxidized; or the oxidization is further oxidizing the protection layer, and the oxidization is first oxidizing the protection layer, thereby reducing or avoiding the oxidization of oxidizing the second initial fin 325.

In some implementations, the material of the protection layer 450 is SiN. The density of SiN is relatively high, and the impact of the subsequent process for the sidewall of the second initial fin 325 can be effectively reduced. In other embodiments, the material of the protection layer may also be SiON, silicon rich oxide (SRO), or a-Si.

It should be noted that, the thickness T1 of the protection layer 450 should not be excessively small or excessively large. If the thickness T1 is excessively small, the second initial fin 325 is easily affected by the subsequent process, thereby changing the initial width W1 of the second initial fin 325, and further making it difficult for the width of the second fin subsequently to meet process requirements. If the thickness T1 is excessively large, not only the process costs and time are increased, but also the process difficulty in removing the protection layer 450 subsequently is increased. Therefore, in some implementations, the thickness T1 of the protection layer 450 is 10 nm to 20 nm.

In some implementations, the protection layer 450 is formed by using an atomic layer deposition process. The atomic layer deposition process has a better step coverage capability, and can improve the forming quality and the conformal coverage capability of the protection layer 450, and the atomic layer deposition process is used to further help improve the uniformity of the thickness T1 of the protection layer 450. In other implementations, the protection layer may also be formed using a chemical vapor deposition process.

Specifically, the step of forming the protection layer 450 includes: forming a protective film conformally covering the initial fin 305 (as shown in FIG. 19), the fin mask layer 400, and the substrate 300; forming a mask layer (not shown in the figure) on the protective film, where the mask layer exposes a protective film on the first initial fin 315 and a protective film on the substrate 300 on two sides of the first initial fin 315; etching the protective film by using the mask layer as a mask, and reserving the residual protective films on the sidewall of the second initial fin 325, on the surface of the fin mask layer 400 on the top of the second initial fin 325, and on the substrate 300 on two sides of the second initial fin 325 as the protection layers 450.

Figure 23:
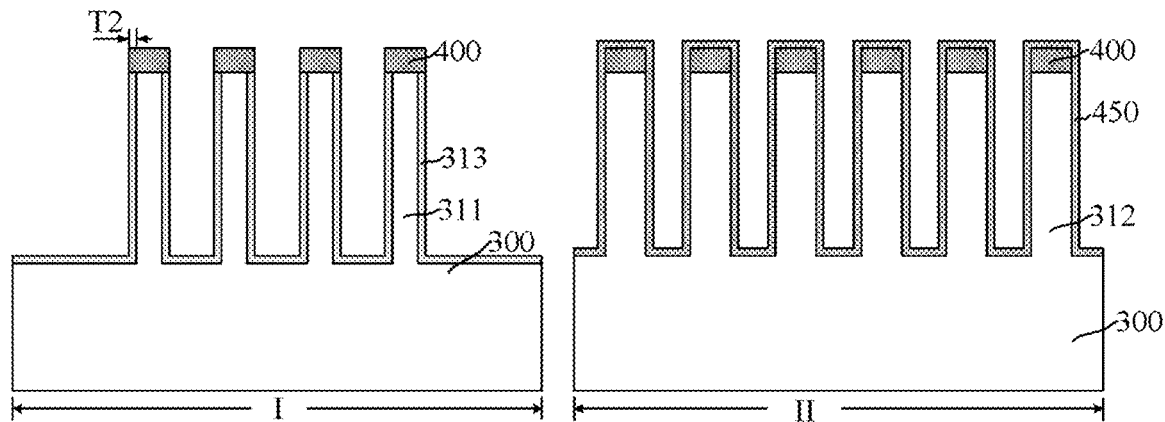

Referring to FIG. 22 and FIG. 23, FIG. 22 is a top view (only a substrate and fins are shown), and FIG. 23 is a sectional view along a GG1 secant line and a KK1 secant line in FIG. 22. After the protection layer 450 is formed, the sidewall of the first initial fin 315 (as shown in FIG. 21) is oxidized, the first initial fin 315 of a partial width is converted into an oxide layer 313. After the oxidization, the first initial fin 315 is used as the first fin 311, and the second initial fin 325 (as shown in FIG. 21) is used as the second fin 312.

The first fin 311 and the second fin 312 are used to form fins 310. The first initial fin 315 of a partial width is converted into the oxide layer 313, so that the width of the first fin 311 can meet the process requirements.

In some implementations, after the oxidization, the second fin 312 has a first width W3, the first fin 311 has a second width W2, and the first width W3 is greater than the second width W2. The first width W3 and the second initial fin 325 have equal initial widths W1 (as shown in FIG. 19), or the first width W3 is slightly less than the initial width W1, that is, the second width W2 is a difference between the initial width W1 and the thickness T2 of the oxide layer 313.

As can be known from the foregoing description, a difference between the first width W3 and the second width W2 is 2 nm to 8 nm, and correspondingly, the thickness T2 of the oxide layer 313 is 10 Å to 40 Å.

It should be noted that, the subsequent procedure further includes forming a gate structure located at the junction of the first region I and the second region II, where the gate structure covers a partial top of the first fin 311, and a partial sidewall of the first fin 311 located on one side of the second region II. The first fin 311 covered by the gate structure is used as a channel of the device. Therefore, the second width W2 needs to meet a dimension regulation of a FinFET structure, thereby ensuring the control capability of the gate structure for the channel, that is, the second width W2 is determined based on the process requirements.

Therefore, in some implementations, the thickness T2 of the oxide layer 313 is adjusted based on settings of the first width W3 and the second width W2.

In some implementations, a process of the oxidization is in a situ steam generation oxidization process. The thickness T2 of the oxide layer 313 is relatively small, and the in situ steam generation oxidization process is used to easily make the thickness T2 of the oxide layer 313 meet the process requirements, and help improve the uniformity of the thickness T2 of the oxide layer 313. In other implementations, the oxide layer may also be used to form a furnace tube process.

In some implementations, the material of the first initial fin 315 is Si, and the material of the oxide layer 313 is correspondingly SiO.

It should be noted that, SiO is a dielectric material, and the oxide layer 313 may be used as a part of an isolation structure subsequently. Therefore, after the oxidization, the oxide layer 313 is reserved, thereby simplifying process steps. In other implementations, the oxide layer may also be removed.

Figure 24:
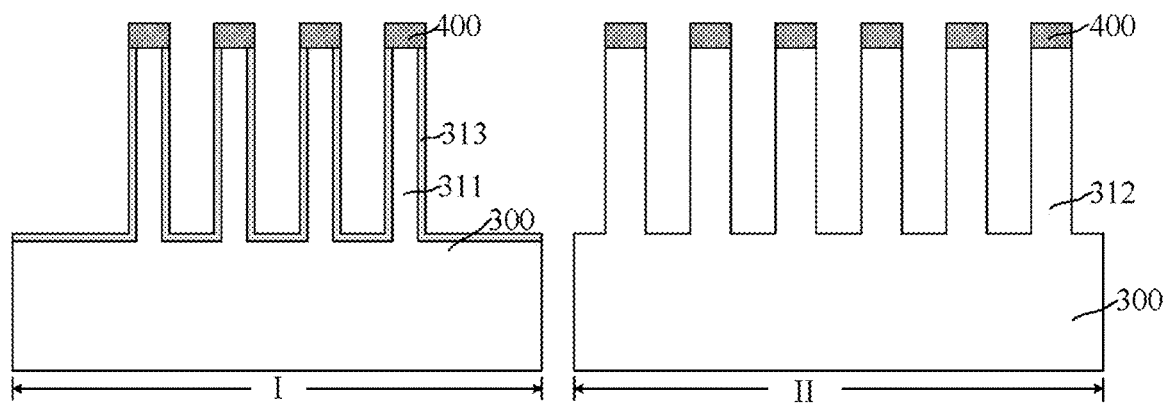

Referring to FIG. 24, after the oxidization, the protection layer 450 (as shown in FIG. 23) is removed.

The quantity of the second fins 312 is greater than the quantity of the first fins 311, and the first width W3 (as shown in FIG. 22) is greater than the second width W2 (as shown in FIG. 22). Therefore, a spacing between neighboring second fins 312 is limited. The protection layer 450 is removed to increase the spacing between the neighboring second fins 312, so that subsequently the material of the isolation structure can be easily filled between the second fins 312.

Moreover, the material of the protection layer 450 is SiN, the material of the isolation structure is generally SiO, and SiO and SiN have an etching selection ratio. Therefore, by removing the protection layer 450, in a process of subsequently forming the isolation structure, the process difficulty of etching back processing can further be reduced.

In other implementations, based on process situations, the protection layer may also be reserved.

Figure 25:
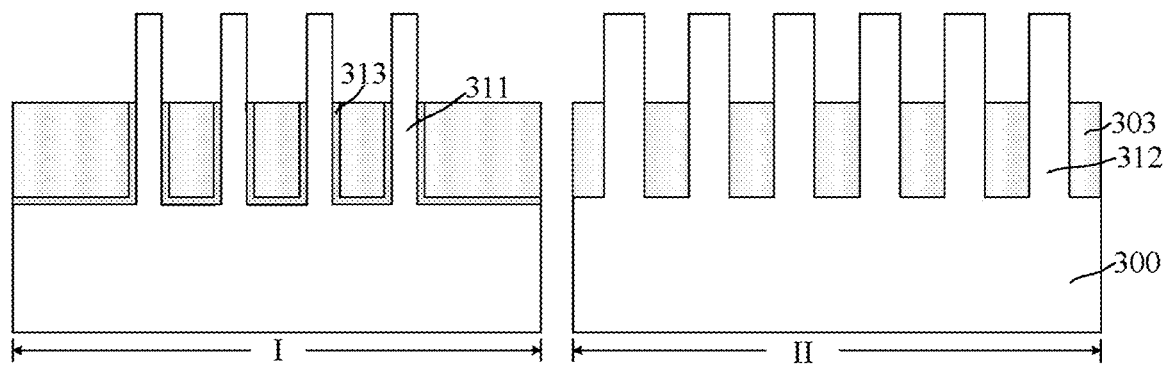

Referring to FIG. 25, an isolation structure 303 is formed on a substrate 300 exposed by the fin 310 (as shown in FIG. 22), where a top of the isolation structure 303 is lower than a top of the fin 310, and the isolation structure 303 covers a partial sidewall of the fin 310.

The isolation structure 303 is used to have an isolation effect on neighboring devices. In some implementations, the material of the isolation structure 303 is SiO.

Specifically, the step of forming the isolation structure 303 includes: forming an isolation material on the substrate 300 exposed by the fin 310, where the isolation material further covers the fin mask layer 400; using a top of the fin mask layer 400 as a stopping position, removing the isolation material higher than the top of the fin mask layer 400 using a flattening process; performing etching back processing on the residual isolation material obtained after the flattening process, and removing the residual isolation material of a partial thickness, where the residual isolation material after obtained the etching back processing is used as the isolation structure 303; and removing the fin mask layer 400.

In some implementations, the material of the oxide layer 313 is SiO. Therefore, in the step of the etching back processing, the oxide layer 313 of a partial height on the sidewall of the first fin 311 is further removed, so that the top of the residual oxide layer 313 on the sidewall of the first fin 311 is aligned with the top of the isolation structure 303.

It should be noted that, after forming the isolation structure 303, the method further includes: forming a gate structure located at the junction of the first region I and the second region II, where the gate structure covers a partial top of the first fin 311, and a partial sidewall of the first fin 311 located on one side of the second region II; and forming a source region in the first fin 311 on one side of the gate structure, and forming a drain region in a second fin 312 on the other side of the gate structure. Specific descriptions of the gate structure, the source region, and the drain region are not described herein again.

It should be further noted that, in some implementations, the first fin 311 with a smaller width is formed by converting the first initial fin 315 of a partial width into an oxide layer 313.

In other implementations, fin mask layers with different widths may also be directly used to form first fins and second fins having different widths. Correspondingly, the step of forming the substrate and the fins includes: forming a first fin mask layer on a base at the junction of the first region and the second region, and forming a second fin mask layer on a base of the second region, where the width of the second fin mask layer is greater than the width of the first fin mask layer; and patterning the base by using the first fin mask layer and the second fin mask layer as masks, to form the substrate and the fins located the substrate.

Specifically, the step of forming the first fin mask layer and the second fin mask layer includes: forming an initial first fin mask layer on a base at the junction of the first region and the second region, and forming a second fin mask layer on a base of the second region, where the initial first fin mask layer and the second fin mask layer have equal widths; etching the initial first fin mask layer by using a mask, and removing the initial first fin mask layer of a partial width, where the residual initial first fin mask layer obtained after the etching is used as the first fin mask layer.

In the present illustrative descriptions of a method for forming a semiconductor substrate, reference may be made to corresponding descriptions in the foregoing implementations. Details are not described herein again.

Correspondingly, implementations of the present disclosure further provides a semiconductor structure. Still referring to FIG. 10 and FIG. 13, FIG. 10 and FIG. 13 are schematic structural diagrams of one form of a semiconductor structure according to the present disclosure. FIG. 10 is a top view (only a substrate and fins are shown), and FIG. 13 is a sectional view along a CC1 secant line and a DD1 secant line in FIG. 10.

The semiconductor structure includes: a substrate 100, including a first region I used to form a well region and a second region II used to form a drift region, where the first region I is adjacent to the second region II; and fins 110 (as shown in FIG. 10), protruding out of the substrate 100, where the fins 110 include first fins 111 located at a junction of the first region I and the second region II, and second fins 112 located on the second region II, where the quantity of the second fins 112 is greater than the quantity of the first fins 111.

In some implementations, the material of the substrate 100 is Si. In other implementations, the material of the substrate may also be another material such as Ge, SiGe, SiC, GaAs, or InGa. The substrate may further be a base of another type, such as a Si base on an insulator or a Ge base on an insulator.

The material of the fin 110 is the same as the material of the substrate 100. In some implementations, the fins 110 and the substrate 100 are an integral structure, and the material of the fin 110 is Si. In other implementations, the material of the fin may also be another material such as Ge, SiGe, SiC, GaAs, or InGa, and the material of the fin may also be different from the material of the substrate.

In some implementations, the semiconductor structure is an LDMOS. Therefore, a well region (not shown in the figure) is formed in the substrate 100 of the first region I and the first fin 111 of the first region I, a drift region (not shown in the figure) is formed in the substrate 100 of the second region II and the second fin 112 of the second region II, and types of doping ions in the drift region and the well region are different.

It should be noted that, a direction in which the first region I points to the second region II is a first direction (not marked), a direction perpendicular to the first direction is a second direction (not marked), and the second region II along the second direction includes a central region 100c (as shown in FIG. 13), and an edge region 100e (as shown in FIG. 13) located on two sides of the central region 100c. The edge region 100e refers to a region that is in the second direction and close to a border of the second region II.

In some implementations, the fin 110 extends along the first direction, the quantities of the first fins 111 and the second fins 112 are plural, the plurality of first fins 111 is arranged parallel along the second direction, and the plurality of second fins 112 are arranged parallel along the second direction.

The quantity of the second fins 112 is greater than the quantity of the first fins 111. Therefore, a position closer to a border of the second region II in the second direction indicates a larger distance between a second fin 112 at the position and a first fin 111.

In the LDMOS, the gate structure is generally located at the junction of the first region I and the second region II, and covers a partial top of the first fin 111 and a partial sidewall of the first fin 111 located on one side of the second region II, a source region is located in the first fin 111 on one side of the gate structure, and a drain region is located in the second fin 112 on the other side of the gate structure. When the device is conducted, a current flows from the drain region to the source region. Compared with a solution in which the first fins and the second fins are in a one-to-one correspondence, in some implementations, the quantity of the second fins 112 is made to be greater than the quantity of the first fins 111, to increase the length of a flow path in which the current flows from the drain region to the source region, thereby reducing a voltage drop on the current flow path, and further improving a breakdown voltage of the LDMOS, so that the device performance of the LDMOS is improved.

A ratio of the quantity of the second fins 112 to the quantity of the first fins 111 should not be excessively small or excessively large. If the ratio is excessively small, an effect of improving the breakdown voltage of the LDMOS is correspondingly worse. If the ratio is excessively large, the resistance of the second fin 112 is correspondingly larger, easily making a startup current smaller, thereby affecting the normal performance of the device. Therefore, in some implementations, the quantity of the second fins 112 is 1.25 to 3 times, for example, 1.5 times, the quantity of the first fins 111.

In some implementations, the semiconductor structure further includes: an isolation structure 103, located on the substrate 100 exposed by the fin 110, where a top of the isolation structure 103 is lower than a top of the fin 110, and the isolation structure 103 covers a partial sidewall of the fin 110.

The isolation structure 103 is used to have an isolation effect on neighboring devices. In some implementations, the material of the isolation structure 103 is SiO. In other implementations, the material of the isolation structure may also be SiN or SiON.

In some implementations, in the second region II, the substrate 100 includes a first substrate 102 (as shown in FIG. 13) located on the central region 100c and a second substrate 101 (as shown in FIG. 13) located on the edge region 100e, and the second fin 112 correspondingly includes a plurality of central fins 112c protruding out of the first substrate 102, and at least one edge fin 112e protruding out of the second substrate 101. A region between neighboring central fins 112c is a first groove 105 (as shown in FIG. 12), a region of two sides of the edge fin 112e is a second groove 106 (as shown in FIG. 12), and the depth H1 of the first groove 105 is less than the depth H2 of the second groove 106.

Compared with a device in the edge region 100e, a device in the central region 100c is more difficult in heat dissipation, and after the quantity of the second fins 112 is increased, heat generated by the drain region is correspondingly increased. Therefore, the depth H1 of the first groove 105 is made to be less than the depth H2 of the second groove 106, to increase a volume ratio of the first substrate 102 in the central region 100c, thereby improving the heat dissipation performance of the device in the central region 100c, and correspondingly, enhancing the dissipation effect of the heat generated by the drain region, thereby further improving a self-heating effect of the device, so that the device performance of the LDMOS is further improved. The depth of the second groove 106 is relatively large, and the thickness of the isolation structure of the edge region 100e is relatively large, so that the isolation structure 103 totally has a better isolation effect, to help reduce the probability of increasing a leakage current of the device.

The depth of the first groove 105 should not be excessively small or excessively large. If the depth is excessively large, the effect for increasing the volume proportion of the first substrate 102 in the central region 100c is relatively poor, thereby reducing the dissipation effect of heat generated by the drain region when the device works, and the effect of improving the self-heating effect is poor. If the depth is excessively small, the thickness of the isolation structure 103 is easily excessively small, and a problem of increasing a leakage current of the device is easily caused. Therefore, in this embodiment, the depth of the first groove 105 is 350 Å to 800 Å.

The depth of the second groove 106 should not be excessively small or excessively large. If the depth is excessively small, the problem of increasing a leakage current is easily caused. If the depth is excessively large, the thickness of the second substrate 101 is excessively small, the thickness of the isolation structure 103 is correspondingly excessively large. The material of the isolation structure 103 is SiO, and a heat conductivity coefficient of SiO is less than a heat conductivity coefficient of Si. Therefore, the heat dissipation performance of the device in the edge region 100e is easily reduced. Therefore, in this embodiment, the depth of the second groove 106 is 1000 Å to 2000 Å.

In some implementations, only one edge fin 112e is formed on the second substrate 101 on one side of the first substrate 102. Therefore, a region of two sides of the edge fin 112e is the second groove 106. In other implementations, when a plurality of edge fins is formed on the second substrate on one side of the first substrate, the second groove may also be a region between neighboring edge fins.

In some implementations, the first fin 111 and the edge fin 112e have equal heights. Therefore, a region between neighboring first fins 111 is also the second groove 106, and the substrate 100 of the first region I is also correspondingly the second substrate 101.

It should be noted that, the semiconductor structure further includes: a third groove 107 (as shown in FIG. 11), located in a first substrate 102 between neighboring first grooves 105, a sidewall of the third groove 107 is aligned with a sidewall of a neighboring central fin 112c, and a bottom of the third groove 107 is aligned with a bottom of the second groove 106. Correspondingly, the isolation structure 103 is further located in the third groove 107.

Therefore, in some implementations, the depth of the third groove 107 is a difference between the depth of the second groove 106 and the depth of the first groove 105.

The third groove 107 is used to increase the thickness of the isolation structure 103 in a partial region of the central region 100e, to help further reduce the probability of increasing the leakage current of the device.

In other implementations, the third groove may also not be formed in the semiconductor structure.

As shown in FIG. 14, in some implementations, the semiconductor structure further includes: a gate structure 120, located at the junction of the first region I and the second region II, where the gate structure 120 covers a partial top of the first fin 111, and a partial sidewall of the first fin 111 located on one side of the second region I.

Based on process requirements, the gate structure 120 may be a polygate structure, or may be a metalgate structure.

It should be noted that, the semiconductor structure further includes: a source region (not shown in the figure), located in the first fin 111 on one side of the gate structure 120; and a drain region (not shown in the figure), located in the second fin 112 on the other side of the gate structure 120. Specific descriptions of the source region and the drain region are not described herein again in this implementation.

The semiconductor structure of some implementations may be formed by using the first form of a method for forming a semiconductor structure described above, or may be formed by using the second form of a method for forming a semiconductor structure described above, or may be formed using another method for forming a semiconductor structure. For specific descriptions of the semiconductor structure of this implementation, reference may be made to corresponding descriptions in the foregoing implementations. Details are not described herein again in this implementation.

Still referring to FIG. 22 and FIG. 25, FIG. 22 and FIG. 25 are schematic structural diagrams of another implementation of the semiconductor structure according to the present disclosure. FIG. 22 is a top view (only a substrate and fins are shown), and FIG. 25 is a sectional view along a GG1 secant line and a KK1 secant line in FIG. 22.

The similarity of this implementation and the foregoing implementations is not described herein again. The difference of this implementation from the foregoing implementations is: As shown in FIG. 22, in a direction perpendicular to an extension direction of the fin 310, the second fin 312 has a first width W3, the first fin 311 has a second width W2, and the first width W3 is greater than the second width W2.

In some implementations, the quantity of the second fins 312 is greater than the quantity of the first fins 311, thereby improving the breakdown voltage of the LDMOS.

Moreover, the first width W3 of the second fin 312 is increased to increase the area of a contact surface of the second fin 312 and the substrate 300, and correspondingly enhance an effect of dissipating heat generated by the drain region to the substrate 300, thereby improving the self-heating effect of the device, so that the device performance of the LDMOS is further improved. The first width W3 of the second fin 312 may be increased to further accelerate the speed of the current flowing out of the drain region, to help further improve the breakdown voltage of the LDMOS.

It should be noted that, a difference between the first width W3 and the second width W2 should not be excessively small or excessively large. If the difference is excessively small, the effect of improving the self-heating effect of the device is correspondingly worse. If the difference is excessively large, in a situation in which the first width W3 is fixed, the first width W3 is excessively large. This not only increases the process difficulty in forming the second fin 312, but also easily causes an excessively small spacing between neighboring second fins 312, thereby affecting the forming of the isolation structure. Therefore, in some implementations, a difference between the first width W3 and the second width W2 is 2 nm to 8 nm.

In some implementations, the semiconductor structure further includes: an isolation structure 303, located on the substrate 300 exposed by the fin 310, where a top of the isolation structure 303 is lower than a top of the fin 310, and the isolation structure 303 covers a partial sidewall of the fin 310.

The isolation structure 303 is used to have an isolation effect on neighboring devices. In some implementations, the material of the isolation structure 303 is SiO.

In some implementations, the semiconductor structure further includes: an oxide layer 313 (as shown in FIG. 25), located between the isolation structure 303 and the first fin 311, where the oxide layer 313 is formed by converting the first fin 311 of a partial width.

In a forming process of the semiconductor structure, to make the first width W3 be greater than the second width W2, generally, initial fins of same widths are first formed, and then the initial fins of a partial width are consumed by oxidizing sidewalls of the initial fins at the junction of the first region I and the second region II, to obtain a first fin 311 with a smaller width dimension.

A part of an oxide layer 313 on the sidewall of the first fin 311 is removed in the process of forming the isolation structure 303. Therefore, a top of the oxide layer 313 on the sidewall of the first fin 311 is aligned with a top of the isolation structure 303.

In some implementations, the second width W2 is a difference between the thickness of the initial width W1 and the thickness of the oxide layer 313. As can be known from the foregoing description, a difference between the first width W3 and the second width W2 is 2 nm to 8 nm, and correspondingly, the thickness T2 (as shown in FIG. 23) of the oxide layer 313 is 10 Å to 40 Å. Specifically, the thickness of the oxide layer 313 is adjusted based on settings of the first width W3 and the second width W2.

In some implementations, the material of the first fin 311 is Si, and the material of the oxide layer 313 is correspondingly SiO.

It should be noted that, in the process of oxidizing the sidewall of the initial fin at the junction of the first region I and the second region II, generally, the substrate 300 at the junction of the first region I and the second region II is further oxidized. Therefore, the oxide layer 313 is further located between the substrate 300 on two sides of first fin 311 and the isolation structure 303.

In some implementations, the semiconductor structure may be formed by using the second method for forming a semiconductor structure, or may be formed by using another method for forming a semiconductor structure. For specific descriptions of this implementation of the semiconductor structure, reference may be made to corresponding descriptions in the foregoing implementations. Details are not described herein again in this implementation.

Although the present disclosure is disclosed as above, the present disclosure is not limited thereto. Various variations and modifications may be made by any person skilled in the art without departing from the spirit and scope of the present disclosure. Therefore, the protection scope of the present disclosure shall be subject to the scope limited by the claims.

What is claimed is:

1. A method for forming a semiconductor structure, comprising:
   providing a base, the base comprising a first region used to form a well region and a second region used to form a drift region, wherein the first region is adjacent to the second region; and
   patterning the base to form a substrate and fins protruding out of the substrate,
   wherein the fins comprise first fins located at a junction of the first region and the second region and second fins located on the second region, and
   wherein a quantity of the second fins is greater than a quantity of the first fins and in a direction perpendicular to an extension direction of the fins, a width of each of the second fins is greater than a width of each of the first fins.

2. The method of claim 1, wherein a direction in which the first region points to the second region is a first direction, a direction perpendicular to the first direction is a second direction, and the second region comprises, along the second direction, a central region and an edge region located on two sides of the central region; and
   wherein a step of forming the second fin comprises:
   patterning the base of the second region, forming a first substrate located on the central region and a plurality of central fins protruding out of the first substrate, and forming a second substrate located on the edge region and at least one edge fin protruding out of the second substrate, wherein a region between neighboring central fins is a first groove, a region of two sides of the edge fin is a second groove, and the depth of the first groove less than the depth of the second groove.

3. The method of claim 2, wherein the depth of the first groove is 350 Å to 800 Å, and the depth of the second groove is 1000 Å to 2000 Å.

4. The method of claim 2, wherein after the first groove is formed, the second groove is formed; or after the second groove is formed, the first groove is formed.

5. The method of claim 2, wherein:
after the first groove is formed, the second groove is formed;
a step of forming the first groove comprises:
    forming a mask material layer on the base;
    forming a core layer on the mask material layer;
    forming a mask sidewall on a sidewall of the core layer;
    forming a sacrificial layer on the core layer and the mask material layer exposed by the mask sidewall;
    forming a graphic layer covering at least a sacrificial layer of the edge region, wherein the graphic layer exposes a sacrificial layer of the central region;
    sequentially etching the sacrificial layer, the mask material layer, and the base of a partial thickness using the graphic layer, the core layer, and the mask sidewall as masks, and forming the first groove in a base of the central region; and
    removing the graphic layer, the core layer, and the sacrificial layer; and
a step of forming the second groove comprises:
    forming a filling layer in the first groove;
    etching the mask material layer using the mask sidewall as a mask, wherein the residual mask material layer obtained after the etching is used as a fin mask layer;
    etching the base using the fin mask layer and the filling layer as masks, and forming the second groove in a base of the edge region; and
    removing the filling layer,
    wherein after the second groove is formed, a third groove is formed in a first substrate between neighboring first grooves, a sidewall of the third groove is aligned with and a sidewall of a neighboring central fin, and a bottom of the third groove is aligned with a bottom of the second groove.

6. The method of claim 2, wherein:
after the second groove is formed, the first groove is formed;
a step of forming the second groove comprises:
    forming a mask material layer on the base;
    forming a core layer on the mask material layer;
    forming a mask sidewall on a sidewall of the core layer;
    forming a sacrificial layer on the core layer and the mask material layer exposed by the mask sidewall;
    after forming the sacrificial layer, forming a graphic layer covering the central region;
    removing a core layer and a sacrificial layer of the edge region by using the graphic layer as a mask;
    after removing the core layer and the sacrificial layer of the edge region, sequentially etching the mask material layer and the base of a partial thickness using the graphic layer and the mask sidewall as masks, and forming the second groove in a base of the edge region; and
    removing the graphic layer, the core layer, and the sacrificial layer; and
a step of forming the first groove comprises:
    forming a filling layer in the second groove;
    etching the mask material layer using the mask sidewall as a mask, wherein the residual mask material layer obtained after the etching is used as a fin mask layer;
    etching the base using the fin mask layer and the filling layer as masks, and forming the first groove in a base of the central region; and
    removing the filling layer.

7. The method of claim 6, wherein a material of the filling layer is a bottom anti-reflective coating (BARC) material, SiO, SiN, or SiON.

8. The method of claim 1, wherein the quantity of the second fins is 1.25 to 3 times the quantity of the first fins.

9. The method of claim 4, wherein a step of forming the substrate and the fins comprises:
    patterning the base to form a substrate and an initial fin protruding out of the substrate, wherein the initial fin comprises a first initial fin located at a junction of the first region and the second region, and a second initial fin located on the second region;
    forming a protection layer on a sidewall of the second initial fin;
    after forming the protection layer, oxidizing a sidewall of the first initial fin, and converting the first initial fin of a partial width into an oxide layer, wherein after the oxidization, the first initial fin is used as the first fin, and the second initial fin is used as the second fin; and
    removing the protection layer.

10. The method of claim 9, wherein a material of the protection layer is SiN, SiON, SRO, or a-Si.

11. The method of claim 9, wherein a thickness of the protection layer is 10 nm to 20 nm.

12. The method of claim 9, wherein the protection layer is formed using an atomic layer deposition process or a chemical vapor deposition process.

13. The method of claim 9, wherein a process of the oxidization is an in situ steam generation oxidization process.

14. The method of claim 9, wherein the forming method further comprises:
    after forming the substrate and the fin, and before forming a gate structure, forming an isolation structure on the substrate exposed by the fin, wherein a top of the isolation structure is lower than a top of the fin, and the isolation structure covers a partial sidewall of the fin; and
    wherein in the step of forming the isolation structure, the oxide layer of a partial height on the sidewall of the first fin is removed, so that a top of the residual oxide layer on the sidewall of the first fin is aligned with a top of the isolation structure.

15. The method of claim 4, wherein a step of forming the substrate and the fins comprises:
    forming a first fin mask layer on a base at the junction of the first region and the second region, and forming a second fin mask layer on a base of the second region, wherein the width of the second fin mask layer is greater than the width of the first fin mask layer; and
    patterning the base by using the first fin mask layer and the second fin mask layer as masks, to form the substrate and the fin located on the substrate.

16. The method of claim 4, wherein the second fin has a first width, the first fin has a second width, and a difference between the first width and the second width is 2 nm to 8 nm.

* * * * *